United States Patent
Green

(10) Patent No.: US 7,498,843 B2
(45) Date of Patent: *Mar. 3, 2009

(54) CURRENT-CONTROLLED CMOS CIRCUITS WITH INDUCTIVE BROADBANDING

(75) Inventor: Michael M. Green, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 445 days.

This patent is subject to a terminal disclaimer.

(21) Appl. No.: 11/343,322

(22) Filed: Jan. 31, 2006

(65) Prior Publication Data

US 2008/0012600 A1 Jan. 17, 2008

Related U.S. Application Data

(63) Continuation of application No. 11/125,455, filed on May 10, 2005, now Pat. No. 7,015,722, which is a continuation of application No. 10/315,473, filed on Dec. 9, 2002, now Pat. No. 6,909,309, which is a continuation of application No. 09/965,235, filed on Sep. 26, 2001, now Pat. No. 6,525,571, which is a continuation of application No. 09/610,905, filed on Jul. 6, 2000, now Pat. No. 6,340,899.

(60) Provisional application No. 60/184,703, filed on Feb. 24, 2000.

(51) Int. Cl.
*H03K 19/094* (2006.01)
(52) U.S. Cl. ............... 326/83; 326/115; 327/407
(58) Field of Classification Search ............... 326/115, 326/83, 86–88, 112, 119, 121; 327/52, 50, 327/65, 81, 89
See application file for complete search history.

(56) References Cited

U.S. PATENT DOCUMENTS

| 6,081,162 | A | * | 6/2000 | Johnson | 330/301 |
|---|---|---|---|---|---|
| 6,111,425 | A | | 8/2000 | Bertin et al. | |
| 6,232,844 | B1 | * | 5/2001 | Talaga, Jr. | 331/57 |
| 6,340,899 | B1 | * | 1/2002 | Green | 326/115 |
| 6,424,194 | B1 | | 7/2002 | Hairapetian | |
| 6,525,571 | B2 | * | 2/2003 | Green | 326/115 |
| 6,909,309 | B2 | * | 6/2005 | Green | 326/115 |
| 7,015,722 | B2 | * | 3/2006 | Green | 326/83 |
| 2002/0017921 | A1 | | 2/2002 | Green | |

FOREIGN PATENT DOCUMENTS

WO   WO 81/01780   6/1981

OTHER PUBLICATIONS

Masakazu Yamashina, Masayuki Mizuno, Koichiro Furuta, Hiroyuki Igura, Masahiro Nomura, Hiroshi Abiko, Kazuhiro Okabe, Atsuki Ono and Hachiro Yamada, "A Low-Supply Voltage GHz MOS Integrated Circuit for Mobile Computing Systems," IEEE Symposium On Low Power Electronics, XP002386133, Oct. 1994, pp. 80-81.

* cited by examiner

*Primary Examiner*—James H Cho
(74) *Attorney, Agent, or Firm*—Garlick Harrison & Markison; Shayne X. Short

(57) ABSTRACT

Various circuit techniques for implementing ultra high speed circuits use current-controlled CMOS ($C^3MOS$) logic with inductive broadbanding fabricated in conventional CMOS process technology. Optimum balance between power consumption and speed for each circuit application is achieved by combining high speed $C^3MOS$ logic with inductive broadbanding/$C^3MOS$ logic with low power conventional CMOS logic. The combined $C^3MOS$ logic with inductive broadbanding/$C^3MOS$/CMOS logic allows greater integration of circuits such as high speed transceivers used in fiber optic communication systems.

20 Claims, 12 Drawing Sheets

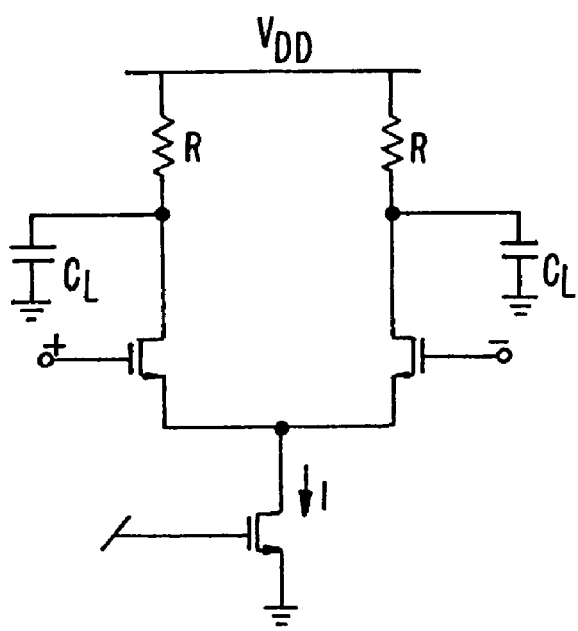 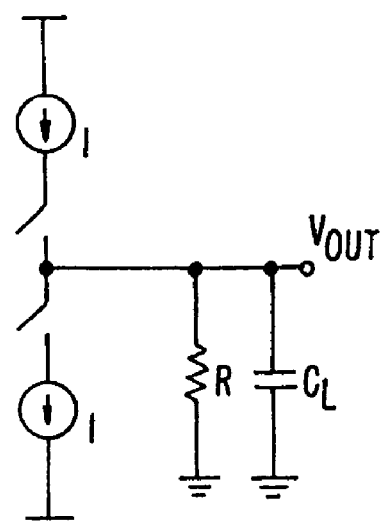
*FIG. 2A.*   *FIG. 2B.*

CURRENT-CONTROLLED CMOS CIRCUITS WITH INDUCTIVE BROADBANDING

CROSS REFERENCE TO RELATED PATENTS/PATENT APPLICATIONS

The present U.S. Utility patent application claims priority pursuant to 35 U.S.C. § 120, as a continuation, to the following U.S. Utility patent application which is hereby incorporated herein by reference in its entirety and made part of the present U.S. Utility patent application for all purposes:

1. U.S. Utility application Ser. No. 11/125,455, entitled "Current-controlled CMOS circuits with inductive broadbanding," filed May 10, 2005, now U.S. Pat. No. 7,015,722 B2, issued on Mar. 21, 2006, which claims priority pursuant to 35 U.S.C. § 120, as a continuation, to the following U.S. Utility patent application which is hereby incorporated herein by reference in its entirety and made part of the present U.S. Utility patent application for all purposes:

2. U.S. Utility application Ser. No. 10/315,473, entitled "Current-controlled CMOS circuits with inductive broadbanding," filed Dec. 9, 2002, now U.S. Pat. No. 6,909,309 B2, issued on Jun. 21, 2005, which claims priority pursuant to 35 U.S.C. § 120, as a continuation, to the following U.S. Utility patent application which is hereby incorporated herein by reference in its entirety and made part of the present U.S. Utility patent application for all purposes:

3. U.S. Utility application Ser. No. 09/965,235, entitled "Current-controlled CMOS circuits with inductive broadbanding," filed Sep. 26, 2001, now U.S. Pat. No. 6,525,571 B2, issued on Feb. 25, 2003, which claims priority pursuant to 35 U.S.C. § 120, as a continuation, to the following U.S. Utility patent application which is hereby incorporated herein by reference in its entirety and made part of the present U.S. Utility patent application for all purposes:

4. U.S. Utility application Ser. No. 09/610,905, entitled "Current-controlled CMOS circuits with inductive broadbanding," filed Jul. 6, 2000, now U.S. Pat. No. 6,340,899 B1, issued on Jan. 22, 2002, which claims priority pursuant to 35 U.S.C. § 119(e) to the following U.S. Provisional Patent Application which is hereby incorporated herein by reference in its entirety and made part of the present U.S. Utility patent application for all purposes:

1. U.S. Provisional Application Ser. No. 60/184,703, entitled "Current-controlled CMOS circuits with inductive broadbanding," filed Feb. 24, 2000.

BACKGROUND OF THE INVENTION

The present invention relates in general to high speed logic circuitry, and in particular to current-controlled CMOS (sometimes referred to as C3MOS, C³MOS, or C³MOS™) logic circuits with inductive broadbanding. devices. Due to the complementary nature of its operation, CMOS logic consumes zero static power. CMOS also readily scales with technology. These two features are highly desirable given the drastic growth in demand for low power and portable electronic devices. Further, with the computer aided design (CAD) industry's focus on developing automated design-tools for CMOS based technologies, the cost and the development time of CMOS VLSI devices has reduced significantly.

The one drawback of the CMOS logic family, however, remains its limited speed. That is, conventional CMOS logic has not achieved the highest attainable switching speeds made possible by modern sub-micron CMOS technologies. As a result of the speed limitations of conventional CMOS logic, integrated circuit applications in the Giga Hertz frequency range have had to look to alternative technologies such as ultra high speed bipolar circuits and Gallium Arsenide (GaAs). These alternative technologies, however, have drawbacks of their own that have made them more of a specialized field with limited applications as compared to silicon MOSFET that has had widespread use and support by the industry. In particular, compound semiconductors such as GaAs are more susceptible to defects that degrade device performance, and suffer from increased gate leakage current and reduced noise margins. Furthermore, attempts to reliably fabricate a high quality oxide layer using GaAs have not thus far met with success. This has made it difficult to fabricate GaAs FETs, limiting the GaAs technology to junction field-effect transistors (JFETs) or Schottky barrier metal semiconductor field-effect transistors (MESFETs). A major drawback of the bipolar technology, among others, is its higher current dissipation even for circuits that operate at lower frequencies.

BRIEF SUMMARY OF THE INVENTION

A significant improvement in speed of operation of CMOS circuitry has been achieved by a family of CMOS logic that is based on current-controlled mechanism. Current-controlled CMOS (or C³MOS) logic is described in greater detail in commonly-assigned patent application Ser. No. 09/484,856, entitled "Current-Controlled CMOS Logic Family," by Hairapetian, which is hereby incorporated in its entirety for all purposes. The basic building block of the C³MOS logic family uses a pair of conventional MOSFETs that steer current between a pair of load devices in response to a difference between a pair of input signals. Thus, unlike conventional CMOS logic, C³MOS logic dissipates static current, but operates at much higher speeds.

According to one aspect of the invention, to further enhance speed of operation of circuits implemented in CMOS technology, the present invention introduces inductive elements in the C³MOS circuits. In a specific embodiment, a spiral inductor is inserted in series with the load devices of selected C³MOS structures that process high-bandwidth data signals. The resulting series combination of inductor and resistive element (e.g., polysilicon resistors) that is in parallel with an existing capacitive load provides a high impedance at a higher bandwidth than would be possible without the presence of the inductor. Optimized values for the inductors ensure appropriate placement of the circuit's natural frequencies in the complex plane to achieve fast rise and fall times with appropriate overshoot and undershoot. The present invention combines the use of this type of shunt peaking with C³MOS circuits that process broadband bi-level (i.e., digital as opposed to analog) differential signals. The combination of these characteristics allows for improvement of the output signal's inter-symbol interference without any increase in power dissipation.

According to another aspect of the invention, a multiplexer circuit includes C³MOS with inductive broadbanding to facilitate operation at ultra-high frequencies.

According to another aspect of the invention, a flip-flop is implemented utilizing C³MOS with inductive broadbanding to operate at ultrahigh frequencies.

According to another aspect of the invention, a complementary metal-oxide-semiconductor (CMOS) logic circuitry combines on the same silicon substrate, current-controlled MOSFET circuitry of the type described above for high speed signal processing, with conventional CMOS logic that does not dissipate static current. Examples of such combined circuitry include serializer/deserializer circuitry used in high speed serial links, high speed phase-locked loop dividers, and the like.

Other features and advantages of the invention will be apparent in view of the following detailed description and appended drawings.

BRIEF DESCRIPTION OF THE SEVERAL VIEWS OF THE DRAWINGS

FIG. 2(a) is a schematic diagram of the circuit of FIG. 1 without the shunt inductor;

FIG. 2(b) is a simplified diagram depicting the transient behavior of the circuit of FIG. 2(a);

DETAILED DESCRIPTION OF THE INVENTION

The present invention provides ultra high-speed logic circuitry implemented in silicon complementary metal-oxide-semiconductor (CMOS) process technology. A distinction is made herein between the terminology "CMOS process technology" and "CMOS logic". CMOS process technology as used herein refers generally to a variety of well established CMOS fabrication processes that form a field-effect transistor over a silicon substrate with a gate terminal typically made of polysilicon material disposed on top of an insulating material such as silicon dioxide. CMOSlogic, on the other hand, refers to the use of complementary CMOS transistors (n-channel and p-channel) to form various logic gates and more complex logic circuitry, wherein zero static current is dissipated. The present invention uses current-controlled mechanisms with inductive broadbanding to develop a family of very fast current-controlled CMOS (or $C^3$MOS™) with inductive broadbanding logic that can be fabricated using a variety of conventional CMOS process technologies, but that unlike conventional CMOS logic does dissipate static current. $C^3$MOS with inductive broadbanding logic or current-controlled metal-oxide semiconductor field-effect transistor (MOSFET) logic are used herein interchangeably.

In a preferred embodiment, the basic building block of this logic family is an NMOS differential pair with series connected inductive/resistive (LR) loads.

Figure 1:
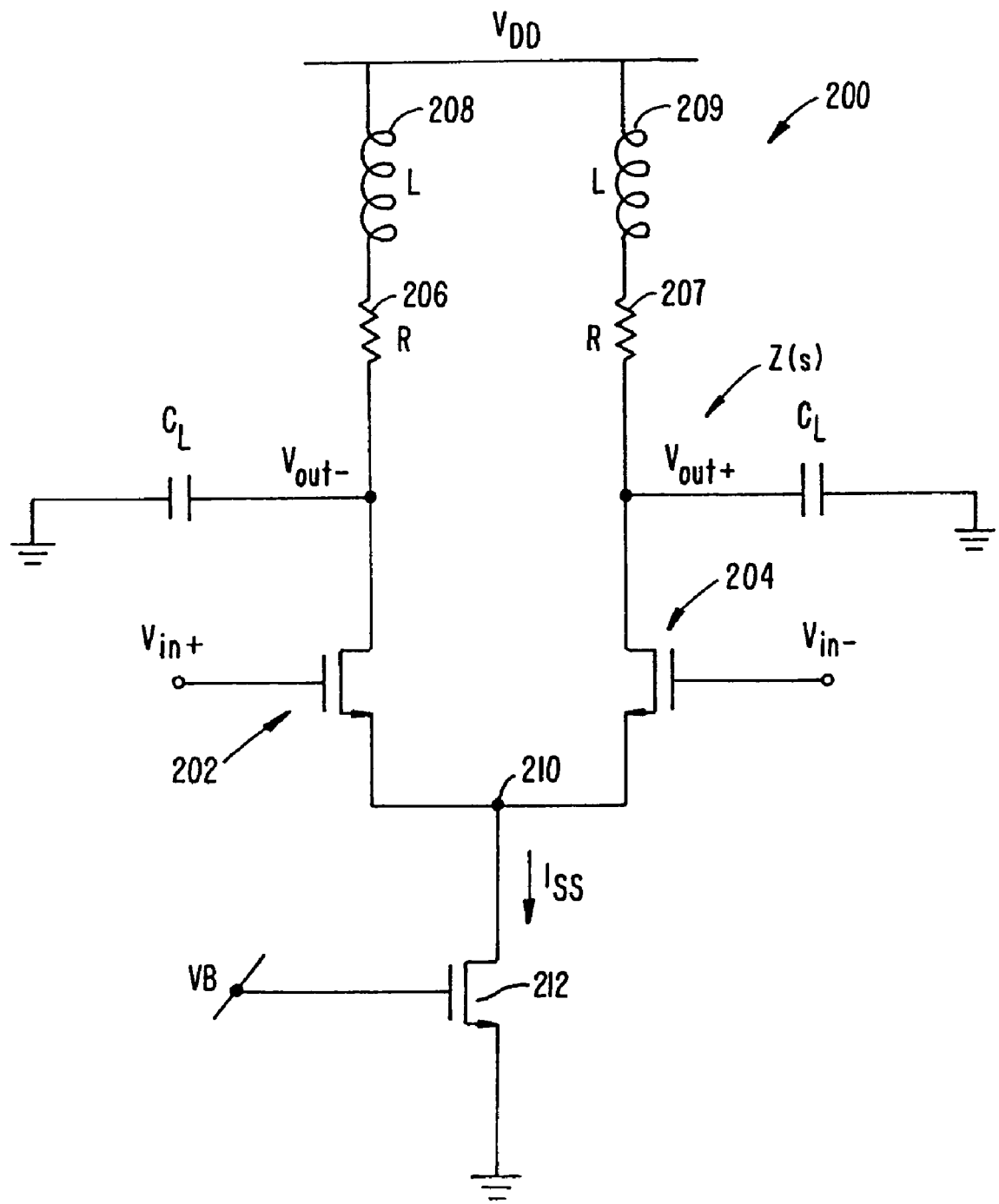
FIG. 1 is a schematic diagram of differential pair including inductive broadbanding implemented with CMOS technology.

FIG. 1 illustrates the basic $C^3$MOS differential pair 200 with shunt inductors L, and load capacitors $C_L$. A pair of n-channel MOSFETs 202 and 204 receive differential logic signals $V_{in}+$ and $V_{in}-$ at their gate terminals, respectively. Resistive loads 206 and 207 in series with shunt inductors 208 and 209 connect the drain terminals of MOSFETs 202 and 204, respectively, to the power supply VDD. Drain terminals of MOSFETs 202 and 204 from the outputs $V_{out}-$ and $V_{out}+$ of the differential pair, respectively. In a preferred embodiment, the shunt inductors 208 and 209 are spiral inductors coupled to the substrate utilizing standard techniques. Resistive loads 206 and 207 may be made up of either p-channel MOSFETs operating in their linear region, or resistors made up of, for example, polysilicon material. In a preferred embodiment, polysilicon resistors are used to implement resistive loads 206 and 207, which maximizes the speed of differential pair 200. The source terminals of n-channel MOSFETs 202 and 204 connect together at node 210. A current-source n-channel MOSFET 212 connects node 210 to ground (or negative power supply). A bias voltage VB drives the gate terminal of current-source MOSFET 212 and sets up the amount of current I that flows through differential pair 200. In response to the differential signal at $V_{in}+$ and $V_{in}-$, one of the two input n-channel MOSFETs 202 and 204 switches on while the other switches off. All of current I, thus flows in one leg of the differential pair pulling the drain terminal ($V_{out}+$ or $V_{out}-$) of the on transistor down to logic low, while the drain of the other (off) transistor is pulled up toward logic high. Shunt peaking, according to the present invention, can be selectively applied to those parts of an integrated circuit that require the bandwidth enhancement.

In FIG. 1, the input levels $V_{in}+$ and $V_{in}-$ vary symmetrically in opposite directions when a digital signal is received. For example if $V_{in}+$ swung positive then $V_{in}-$ would swing negative. The voltage levels at $V_{out}-$ and $V_{out}+$ swing in the same direction as the respective input signal levels. For reasons described more fully below, for broadband signals including frequencies in the range of over 5 GigaHz the transient response of the circuit must be fast.

Figure 2C:
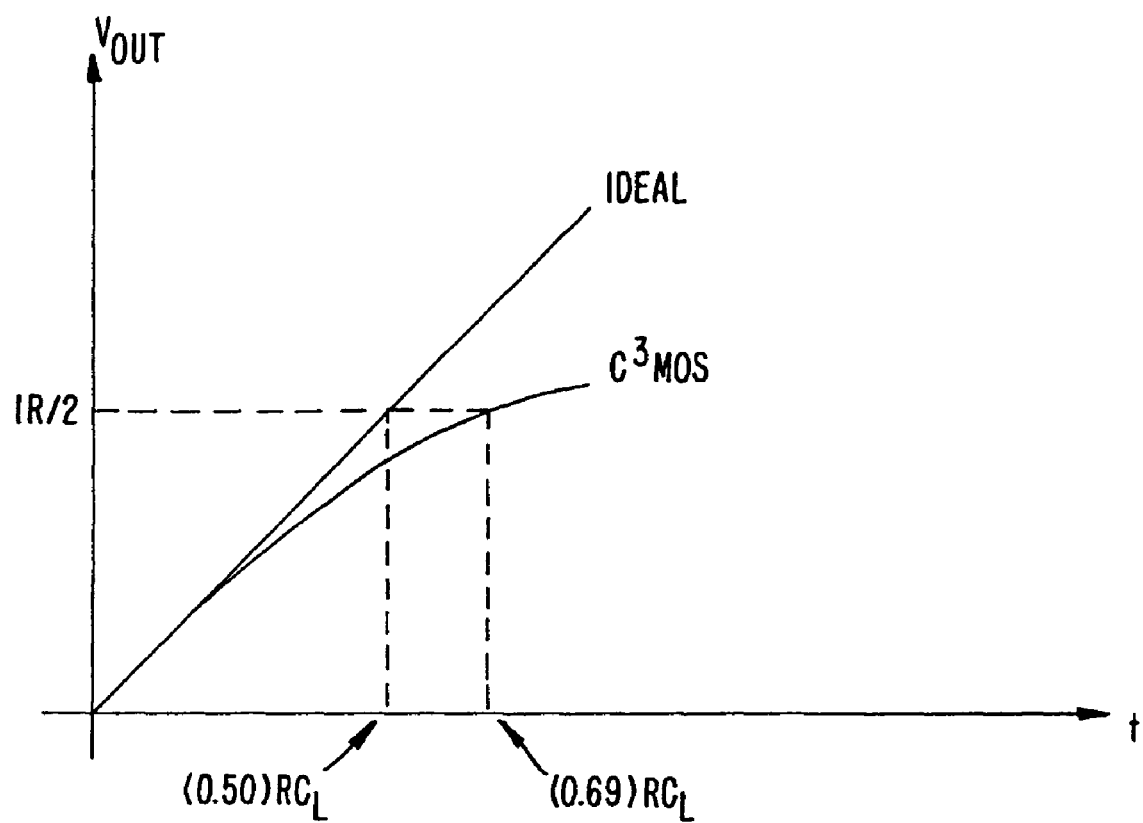
FIG. 2(c) is a graph depicting the difference between ideal and $C^3$MOS step responses.

FIGS. 2(a) and (b) respectively depict the circuit of FIG. 1 with the inductors removed, resulting in a $C^3$MOS buffer, and a simple equivalent circuit illustrating the transient behavior of the circuit. In this case the output transient waveform is characterized by an exponential waveform with a time constant RC. This waveform is depicted in FIG. 2(c) with a label "$C^3$MOS" and has an initial slope of $I/C_L$. The difference between the ideal and exponential step response is also depicted in FIG. 2(c).

In the circuit of FIG. 2(a) the transient response of the output signal would be controlled by the RC time constant. It is clear from FIG. 2(c) that the presence of the load resistor significantly slows down the transient step response. Thus, when an input signal is received with a very fast rise time the current increases rapidly to charge or discharge the load capacitor. However, the transient response of the output signal is controlled by the RC time constant and can have a longer rise time than the input pulse.

Now, consider the circuit as disclosed in FIG. 1, including the inductors, as is well-known in the art an inductor resists a change in current. Thus, when the drain current changes in response to an input signal the inductor chokes off current flow through the resistor so that the capacitor discharges rapidly to generate an output signal with a small rise time.

Figure 3:
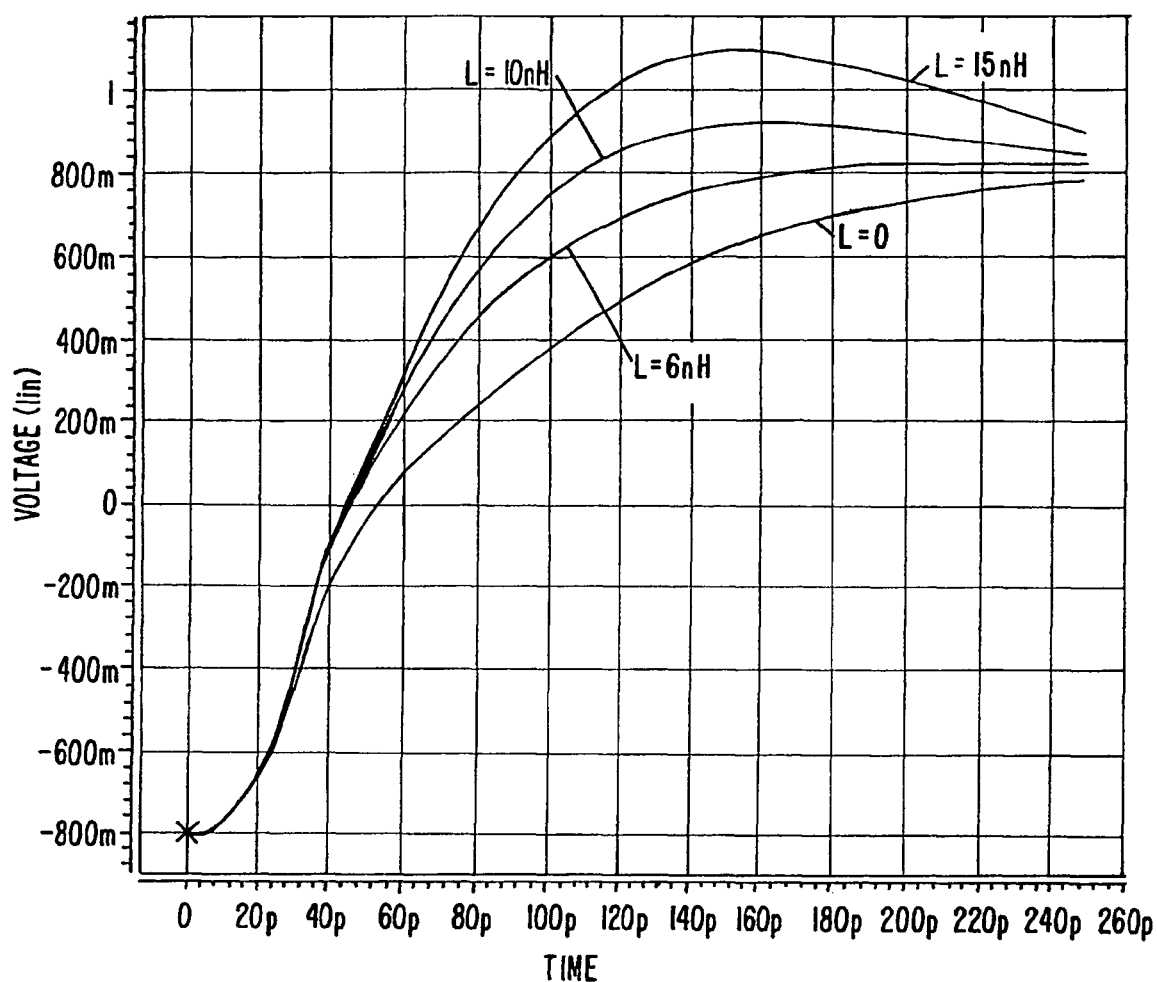
FIG. 3 is a graph depicting the step response of the circuit of FIG. 1 for four values of series inductance.

The larger the value of series inductance, the longer the full value of the current is available to charge/discharge the load capacitances. FIG. 3 shows the step response for 4 different values of series inductance.

From FIG. 3 it is clear that higher values of inductance decrease the rise time. However, if the inductance value becomes too large, an excessive overshoot will occur. To determine the optimum value of inductance, the pulse response for a set of input pulses is observed with varying pulse widths. The graphs in FIG. 4(a) show the relative error between output and input pulse widths (referred to as intersymbol interference or ISI) for 4 values of inductance.

Figure 4A:
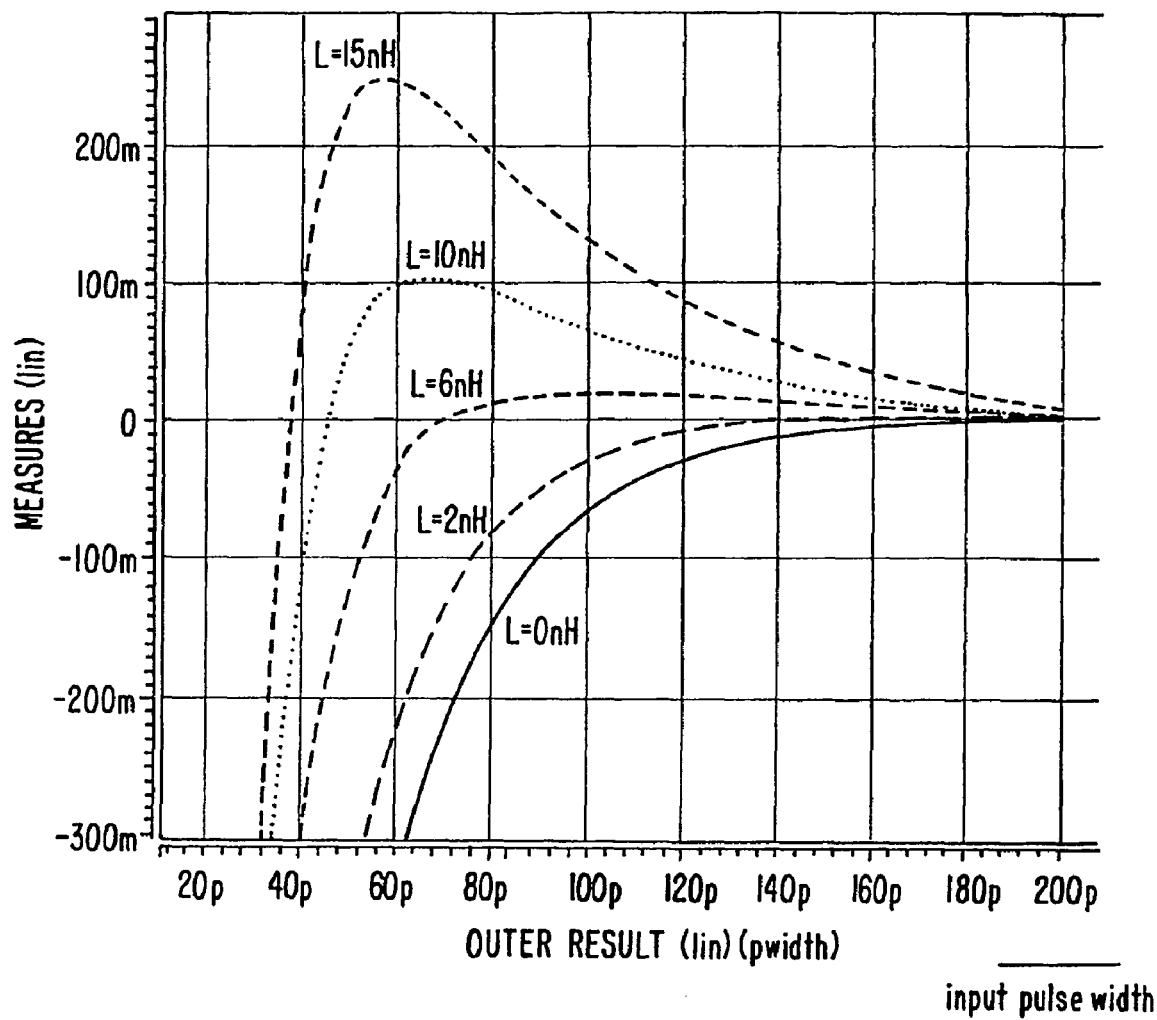
FIG. 4(a) is a graph depicting inter-symbol interference (ISI) vs input pulse width for five values of series inductance.

From the FIG. 4(a) graphs it is apparent that given the values of R and $C_L$, the optimum indictor value is given by:

$$L_{S(opt)}=(0.35)*C_L R^2$$

Figure 4B:
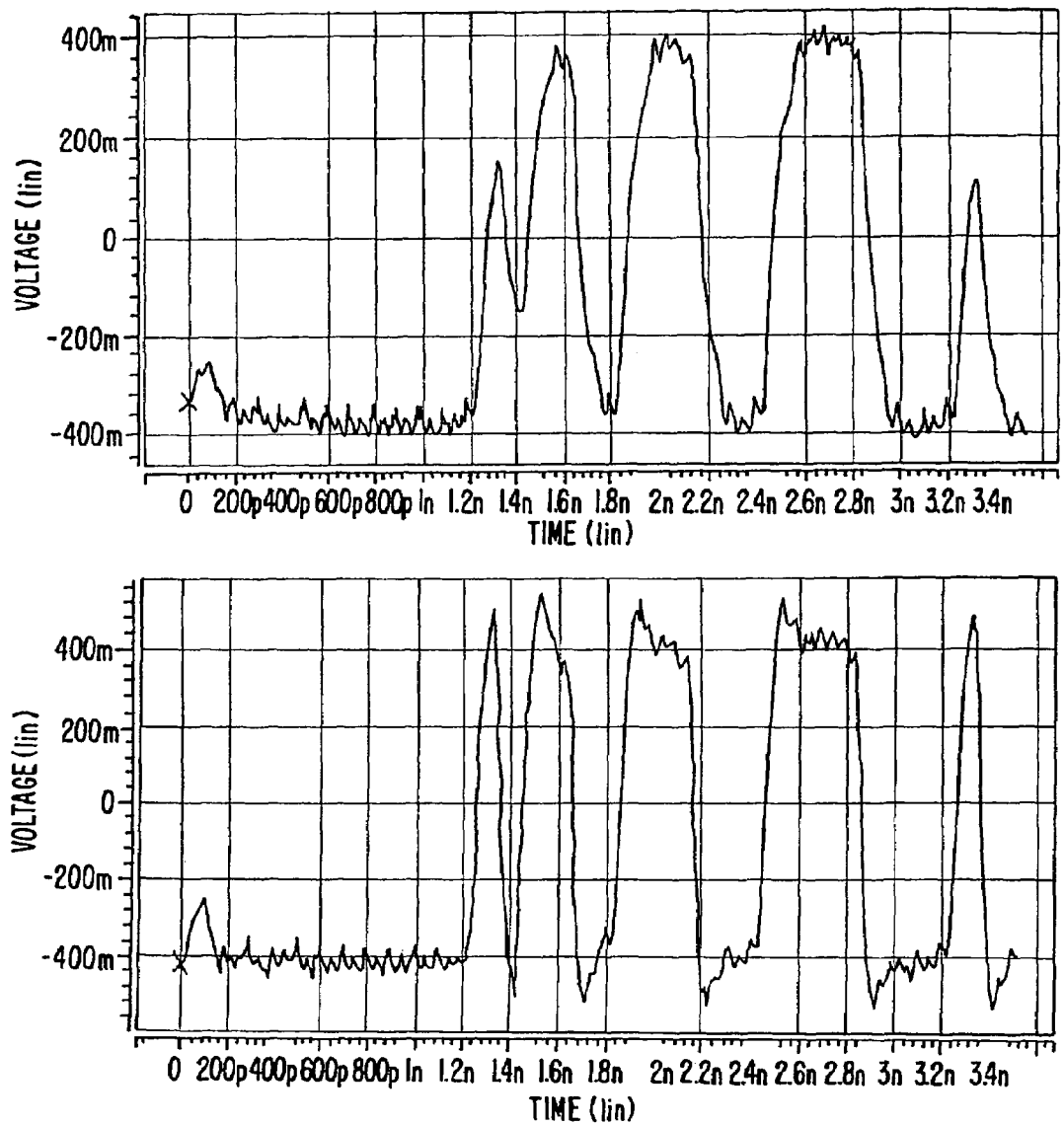
FIG. 4(b) is a graph depicting the output signal of the circuit of FIG. 1 with and without inductors.

FIG. 4(b) depicts the output signals for the circuit of FIG. 1 with and without the inductors. The magnitude of the time intervals between zero crossing points of the output signal provide important information for interpreting the input signal. As depicted in FIG. 4(b), the slope of the waveform zero-crossings is sharper when the inductors are included in the circuit thereby more precisely defining the time intervals between zero-crossing points and reducing inter-symbol interference.

In one embodiment of the present invention a transceiver circuit along a fiber optic channel deserializes an input data stream with a bit rate of, for example, 10 Gb/s. After processing the lower frequency deserialized data, the data is serialized before transmission back onto the fiber channel. According to the present invention, those parts of this circuitry that process the highest speed data (e.g., input to the deserializer and output of the serializer) are implemented by $C^3MOS$ circuitry with inductive broadbanding.

Figure 5:
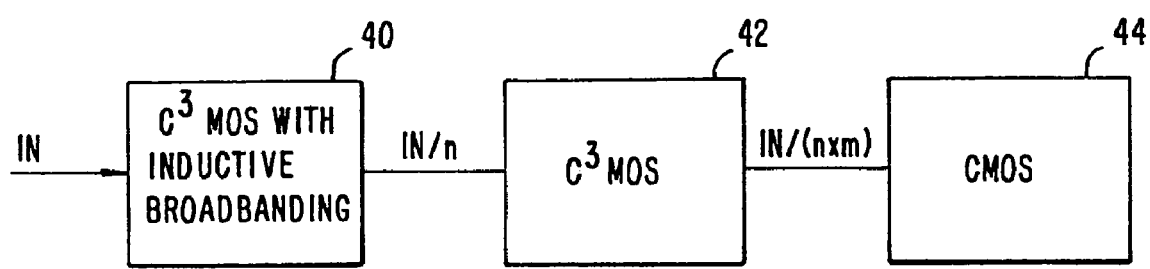
FIG. 5 shows a block diagram for a circuit that combines $C^3$MOS with inductive broadbanding, $C^3$MOS, and conventional CMOS logic on a single silicon substrate to achieve optimum tradeoff between speed and power comsumption.

FIG. 5 shows a simplified block diagram illustrating this exemplary embodiment of the invention. A $C^3MOS$ with inductive broadbanding input circuit 40 receives a high frequency input signal IN and outputs a first divided down version of the signal IN/n. A $C^3MOS$ MUX 42 then receives this first divided down version and divides the received signal down by another factor of m to output a second divided down version of the signal IN/(n×m). The lower frequency signal IN/n×m) is then processes by core circuitry 44 that is implemented in conventional CMOS logic. The low frequency signal from the core logic is then increased in frequency by the reverse process to form an output signal at the original high input frequency.

Figure 6A:
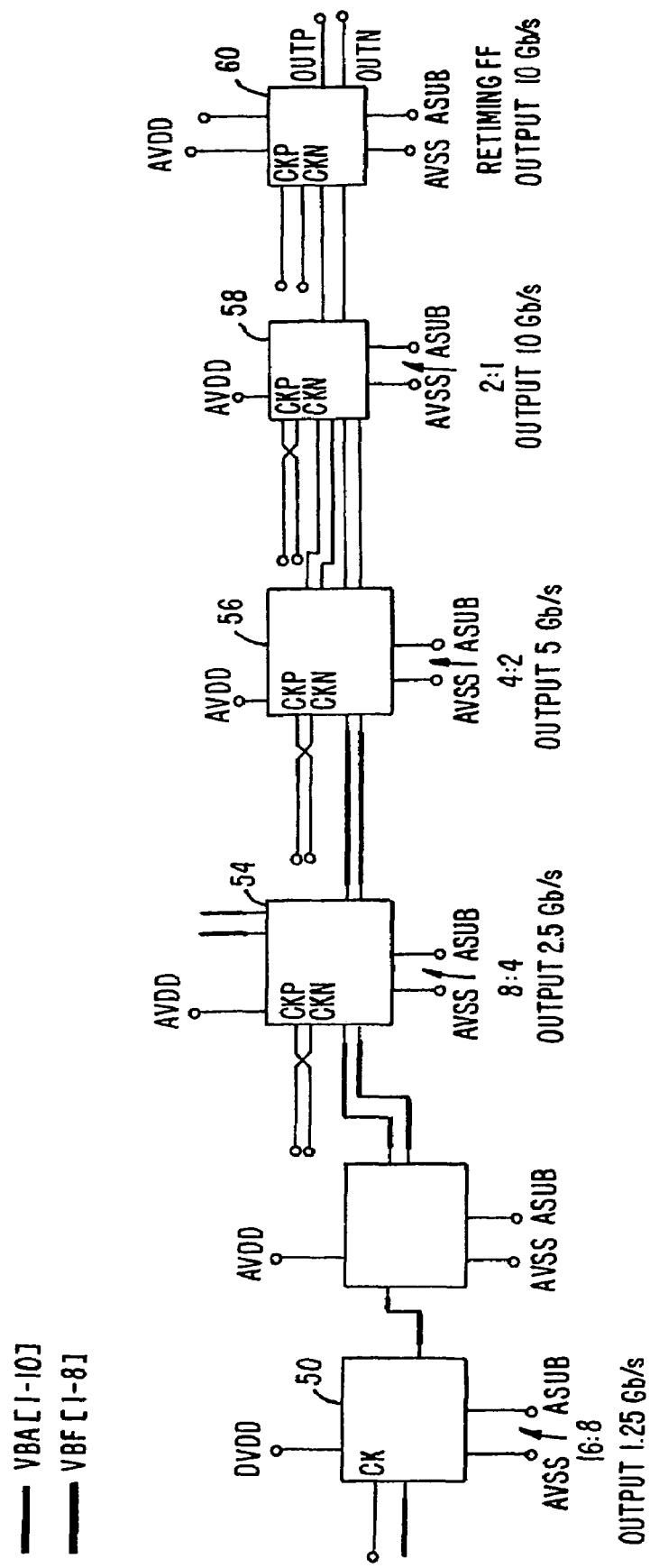
FIG. 6(a) is a schematic diagram of a serializer circuit utilizing features of the invention.

FIG. 6(a) shows an exemplary 16:1 serializer according to the present invention. The serializer includes a 16:8 multiplexer 50 that converts the data rate to 1.25 Gb/s, followed by an 8:4 multiplexer 54 that converts the data rate to 2.5 Gb/s. The 2.5 Gb/s data is further converted to a 5 Gb/s data by a 4:2 multiplexer 56, and finally to a 10 Gb/s data by a 2:1 multiplexer 58. A flip flop 60 at the output re-times the 10 Gb/s data to generate the final output data stream. combine conventional CMOS logic used for the lower speed multiplexers and core processing circuitry, with $C^3MOS$ logic for the mid-rate multiplexers, and $C^3MOS$ logic with inductive broadbanding for the highest speed multiplexer (i.e., the 2:1 multiplexer 58) as well as the output re-timing flip flop 60.

As illustrated by the various $C^3MOS$ with inductive broadbanding logic elements described below, all of the building blocks of any logic circuitry can be constructed using the $C^3MOS$ with inductive broadbanding technique of the present invention. More complex logic circuits such as shift registers, counters, frequency dividers, etc., can be constructed in $C^3MOS$ with inductive broadbanding using the basic elements described above. As mentioned above, however, both $C^3MOS$ and $C^3MOS$ with inductive broadbanding logic does consume static power. Additionally, the fabrication of $C^3MOS$ with inductive broadbanding logic is more expensive than $C^3MOS$ or CMOS because of the need to add inductors to the IC.

The static current dissipation of $C^3MOS$ and/or $C^3MOS$ with inductive broadbanding may become a limiting factor in certain large scale circuit applications. In one embodiment, as depicted for example in FIGS. 5 and 6(a), the present invention combines $C^3MOS$ with inductive broadbanding and $C^3MOS$ logic with conventional CMOS logic to achieve an optimum balance between speed and power consumption. According to this embodiment of the present invention, an integrated circuit utilizes $C^3MOS$ with inductive broadbanding logic for the ultra high speed (e.g., 10 Gb/s) portions of the circuitry, $C^3MOS$ for very high speed parts of the circuit (e.g., 2.5-5 Gb/s) and conventional CMOS logic for the relatively lower speed sections. For example, to enable an integrated circuit to be used in ultra high speed applications, the input and output circuitry that interfaces with and processes the high speed signals is implemented using $C^3MOS$ with inductive broadbanding. The circuit also employs $C^3MOS$ to divide down the frequency of the signals being processed to a low enough frequency where conventional CMOS logic can be used. The core of the circuit, according to this embodiment, is therefore implemented by conventional CMOS logic that consumes zero static current.

Figure 6B:
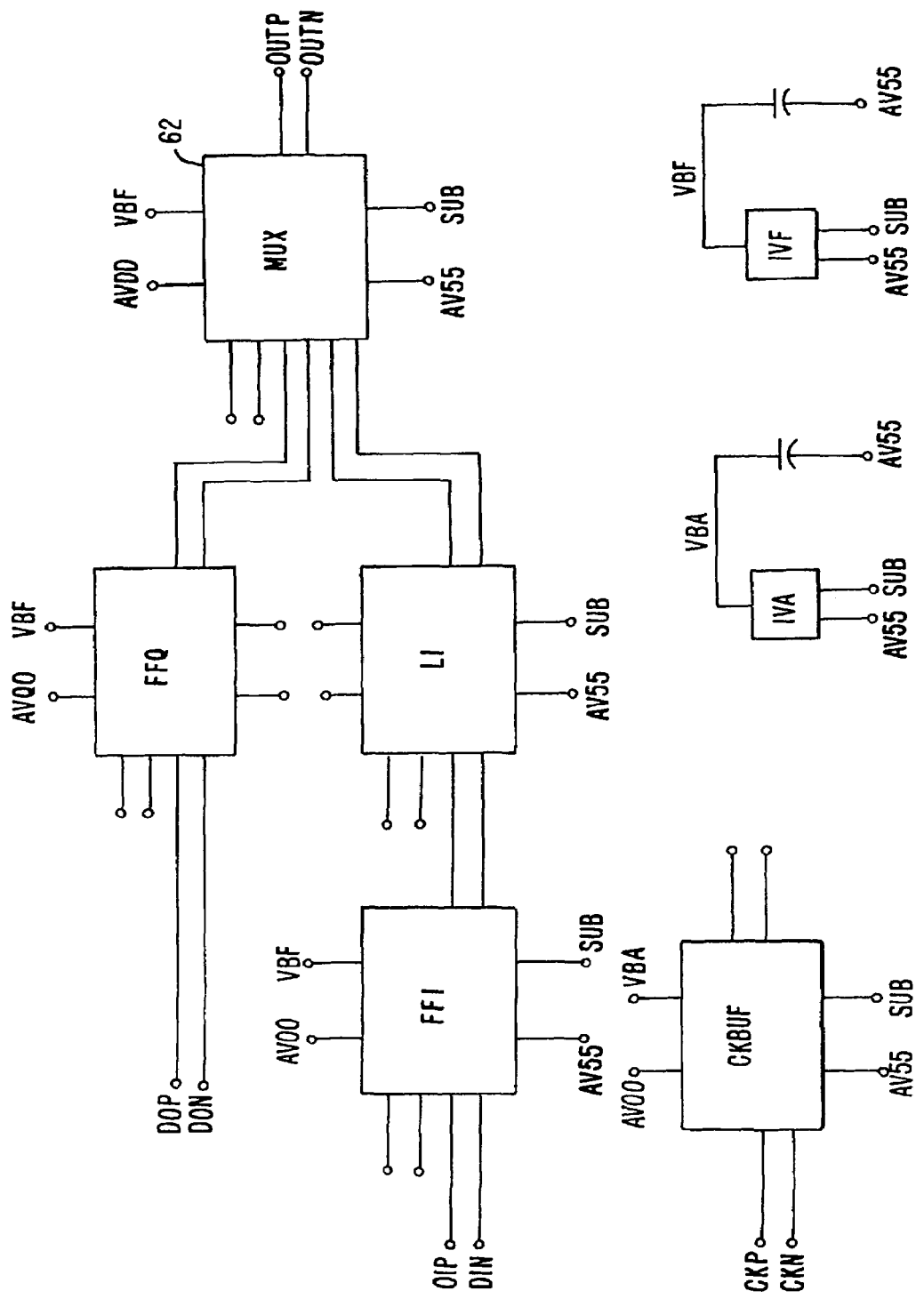
FIG. 6(b) is a more detailed depiction of the 2:1 MUX depicted in FIG. 6(a)
Figure 7:
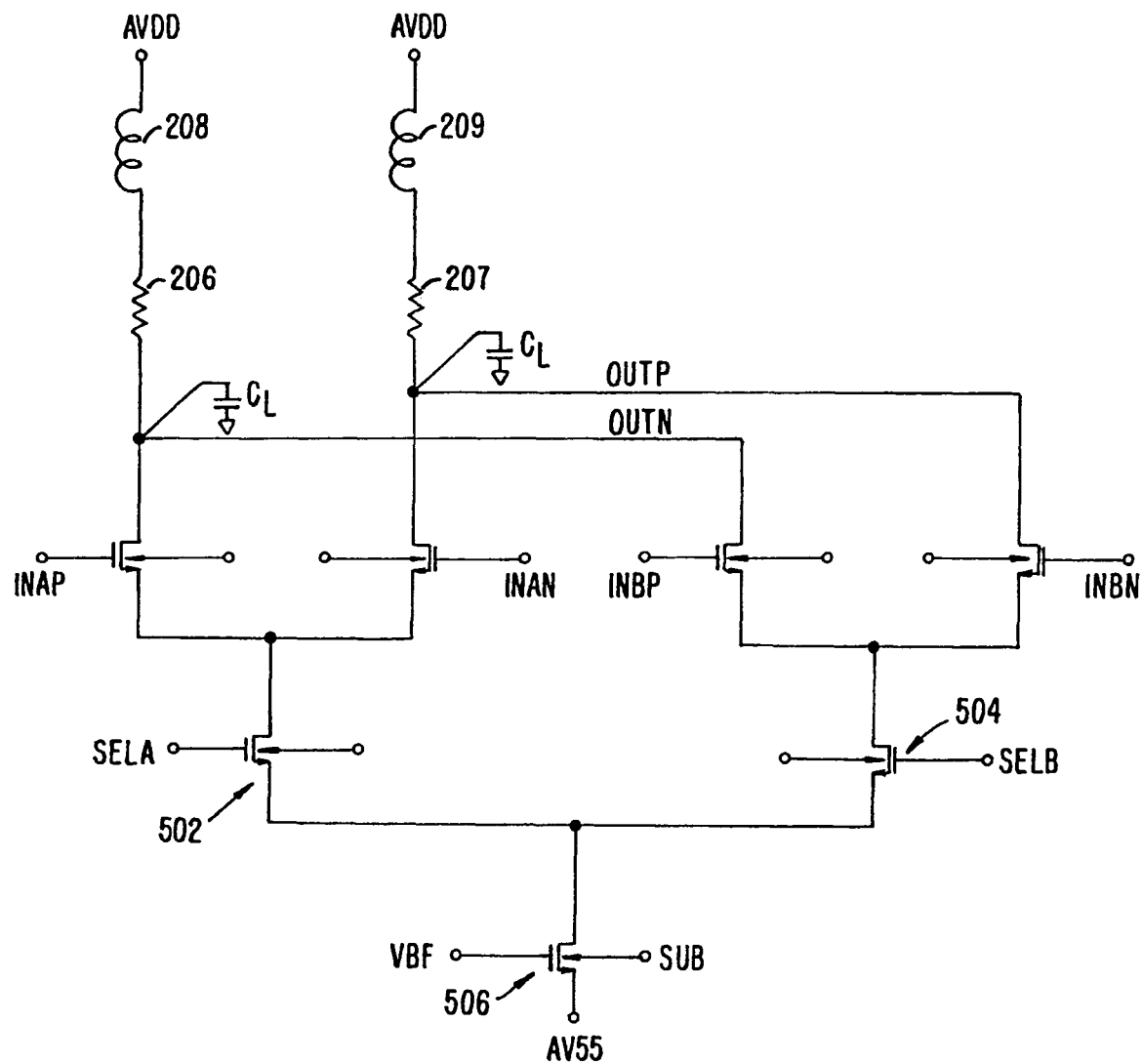
FIG. 7 is a circuit diagram of a MUX utilizing features of the present invention.

FIG. 6(b) shows an implementation of the 2:1 multiplexer 58 wherein the actual output multiplexing circuit 62 uses $C^3MOS$ with inductive broadbanding an implementation of which is shown in FIG. 7.

FIG. 7 shows an exemplary $C^3MOS$ with inductive broadbanding implementation for a 2:1 multiplexer 62. Similar to the other $C^3MOS$ logic gates, multiplexer 62 includes a differential pair for each input. The positive (left) input transistor of each differential pair is coupled to VDD through by a first resistor 206 connected in series with a first series inductor 208 and the negative (right) input transistor of each differential pair is coupled to VDD through by a second resistor 207 connected in series with a second series inductor 209. The multiplexer 62 further includes select transistors 502 and 504 inserted between the common source terminals of the differential pairs and the current source transistor 506. By asserting one of the select input signals SELA or SELB, the bias current is steered to the differential pair associated with that select transistor. Thus, signal SELA steers the bias current to the differential pair with AP and AN inputs, and signal SELB steers the bias current to the differential pair with BP and BN inputs.

Figure 8:
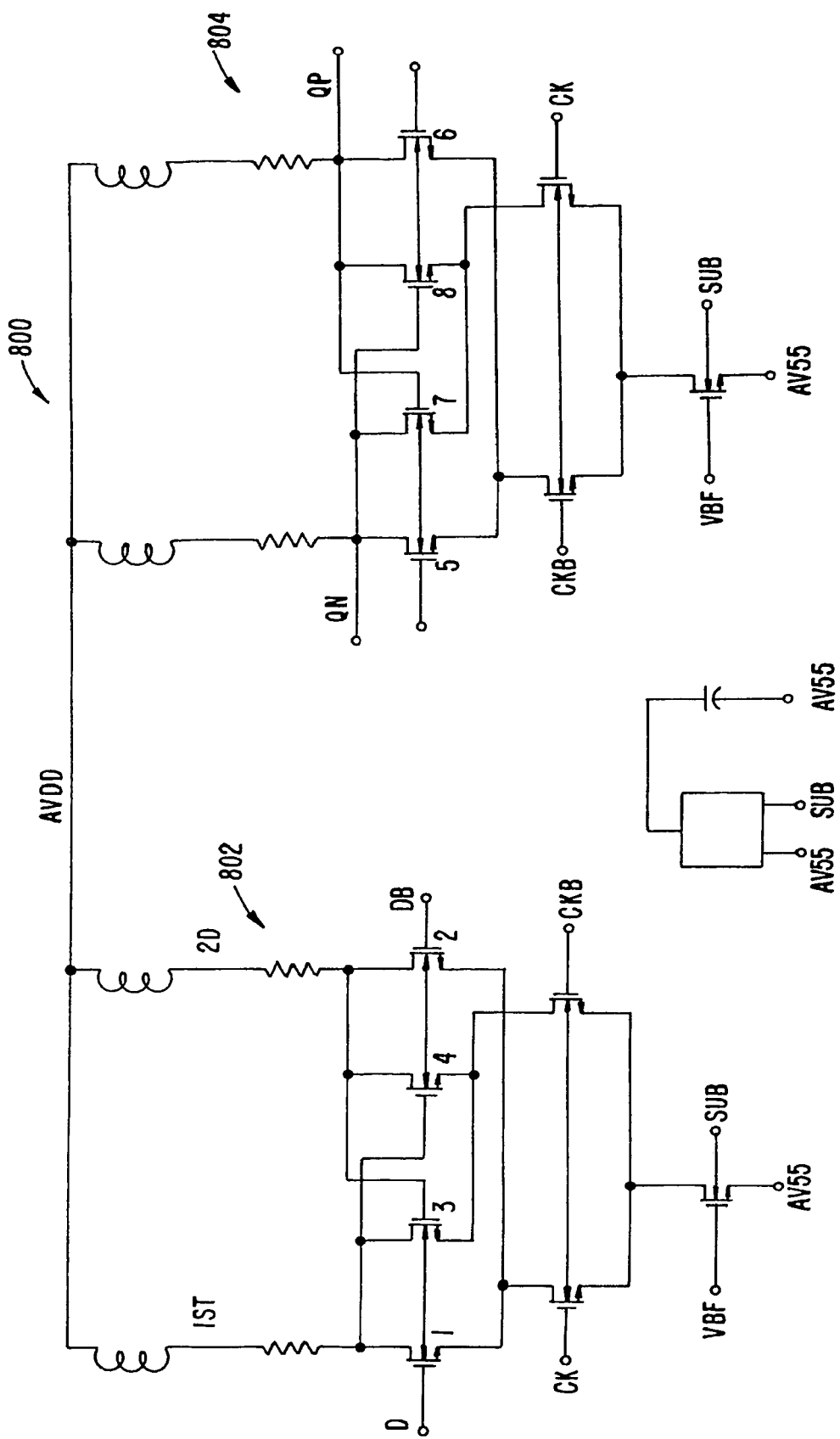
FIG. 8 is a circuit diagram of a flip-flop utilizing features of the invention.

FIG. 8 shows an exemplary implementation of a $C^3MOS$ flip flop with inductive broadbanding for use as the re-timing flip flop in the serializer of FIG. 5. A $C^3MOS$ master-slave flip-flop 800 according to the present invention can be made by combining two latches 802 and 804. A first latch 802 receives differential input signals D and $\overline{D}$ and generates differential output signals QI and QI. The differential output signals QI and $\overline{QI}$ are then applied to the differential inputs of a second latch 804. The differential outputs Q and $\overline{Q}$ of second latch 804 provide the outputs of flip-flop 800. The input transistors of each latch are coupled to VDD by a resistor and shunt inductor coupled in series.

It is to be understood that all $C^3MOS$ logic elements, numerous examples of which are described on the above-referenced commonly-assigned patent application can employ the inductive broadbanding technique according to the present invention.

Figure 9:
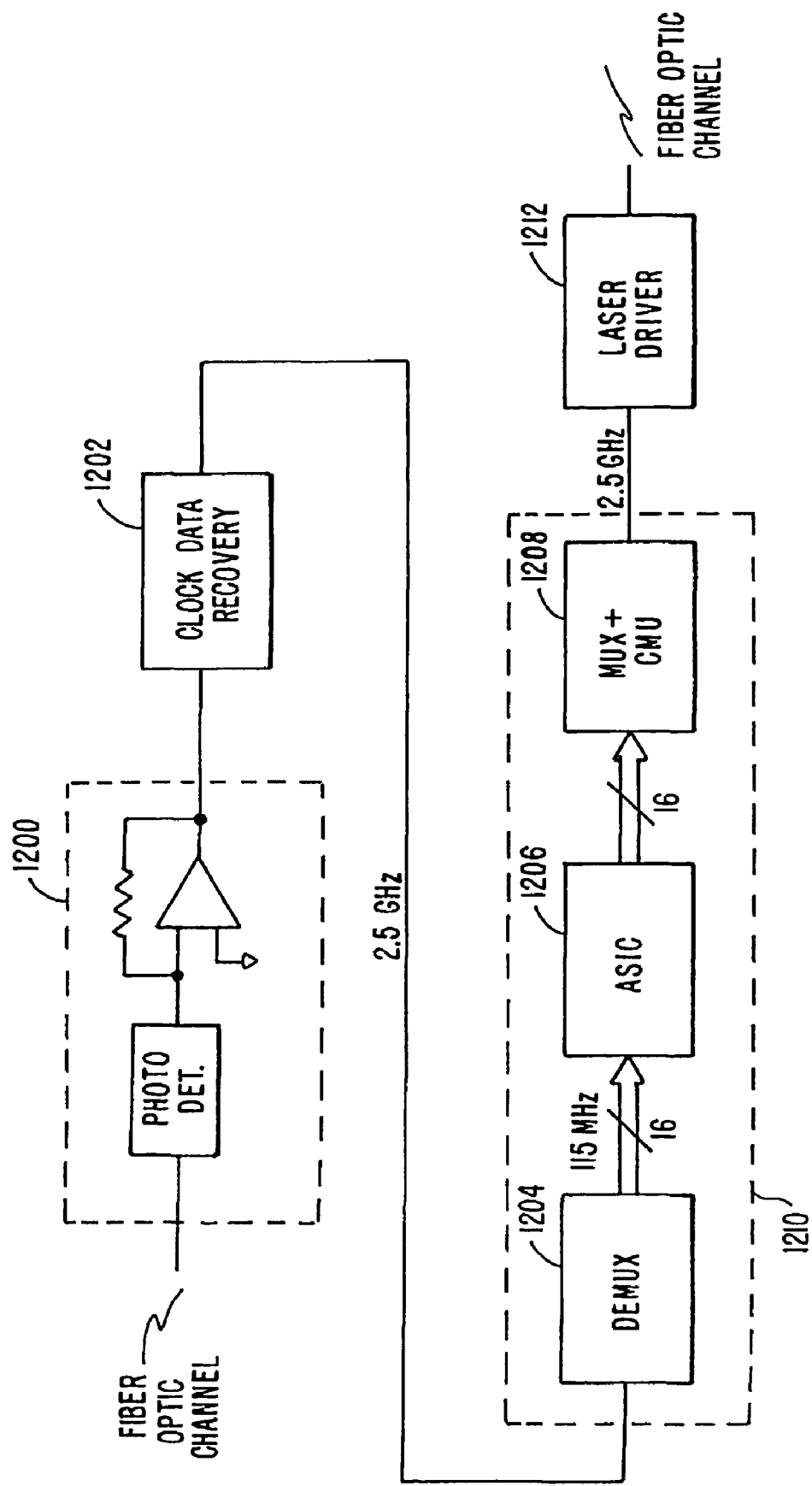
FIG. 9 is a simplified block diagram of a transceiver system that utilizes the $C^3$MOS with inductive broadbanding $C^3$MOS/CMOS combined logic according to the present invention to facilitate interconnecting high speed fiber optic communication channels.

According to one embodiment of the present invention the combined C³MOS with inductive broadbanding/C³MOS/CMOS circuit technique is employed in a transceiver of the type illustrated in FIG. 9. The exemplary transceiver of FIG. 9 is typically found along fiber optic channels in high speed telecommunication networks. The transceiver includes at its input a photo detect and driver circuit 1200 that receives the input signal from the fiber optic channel. Circuit 1200 converts fiber-optic signal to packets of data and supplies it to a clock data recovery (CDR) circuit 1202. CDR circuit 1202 recovers the clock and data signals that may be in the frequency range of about 10 GHz, or higher. Established telecommunication standards require the transceiver to perform various functions, including data monitoring and error correction. These functions are performed at a lower frequency. Thus, the transceiver uses a demultiplexer 1204, depicted in FIGS. 5 and 6, which deserializes the 10 Gb/s data stream into, for example, 16 parallel signals having a bit rate of about 622 Mb/s. An application specific integrated circuit (ASIC) 1206 then performs the monitoring and error correction functions at the lower (622 Mb/s) bit rate. A multiplexer and clock multiplication unit (CMU) 1208 converts the parallel signals back into a single bit stream at 10 Gb/s. This signal is then retransmitted back onto the fiber optic channel by a laser drive 1212. The combined C³MOS with inductive broadbanding/C³MOS/CMOS technique of the present invention allows fabrication of demultiplexer 1204, ASIC 1206 and multiplexer and CMU 1208 on a single silicon die. That is, demultiplexer 1204 and multiplexer CMU 1208 are implemented in C³MOS with inductive broadbanding/C³MOS with ASIC 1206 implemented in conventional CMOS.

In conclusion, the present invention provides various circuit techniques for implementing ultra high speed circuits using current-controlled CMOS (C³MOS) logic and C³MOS with inductive broadbanding logic fabricated in conventional CMOS process technology. In one embodiment, the present invention advantageously combines high speed C³MOS with inductive broadbanding/C³MOS with inductive broadbanding/C³MOS logic with low power conventional CMOS logic. According to this embodiment, circuits such as transceivers along fiber optic channels can be fabricated on a single chip where the ultra-high speed portions of the circuit utilize C³MOS with inductive broadbanding/C³MOS and the relatively lower speed parts of the circuit use conventional CMOS logic.

While the above is a complete description of the preferred embodiment of the present invention, it is possible to use various alternatives, modifications and equivalents. For example, although spiral inductors and poly resistors are utilized in the preferred embodiment other techniques known to persons of skill in the art can be utilized. Therefore, the scope of the present invention should be determined not with reference to the above description but should, instead, be determined with reference to the appended claims, along with their full scope of equivalents.

What is claimed is:

1. An apparatus, comprising:
a first circuitry, implemented using current-controlled complementary metal-oxide semiconductor (C³MOS) logic with inductive broadbanding, wherein logic levels are signaled by current steering in one of two or more branches in response to differential input signals that correspond to a first signal, and wherein first and second series connected RL circuits respectively couple first and second output nodes of a logic element to a power supply node, that is operable to:
receive the first signal;
process the first signal thereby generating a first plurality of signals such that each signal of the first plurality of signals has a first frequency; and
output the first plurality of signals; and
a second circuitry, implemented using conventional complementary metal-oxide-semiconductor (CMOS) logic wherein substantially zero static current is dissipated, that is operable to:
receive the first plurality of signals;
process the first plurality of signals thereby generating a second signal such that the second signal has a second frequency; and
output the second signal.

2. The apparatus of claim 1, wherein:
the second circuitry it is operable to process the first plurality of signals thereby generating a second plurality of signals such that each signal of the second plurality of signals has the second frequency; and
the second signal is one signal within the second plurality of signals.

3. The apparatus of claim 1, wherein:
the first signal has a third frequency;
the third frequency is less than the first frequency; and
the third frequency is less than the second frequency.

4. The apparatus of claim 1, wherein:
the first signal is a serialized signal; and
the first signal is deserialized to generate the first plurality of signals that is a deserialized version of the first signal.

5. The apparatus of claim 1, further comprising:
a first capacitive load coupled to the first output node of the logic element; and
a second capacitive loads coupled to the second output node of the logic element.

6. The apparatus of claim 1, wherein:
each RL circuit of the first and second series connected RL circuits includes a resistor and an inductor connected in series; and
the inductor of each RL circuit of the first and second series connected RL circuits is a spiral inductor coupled to the silicon substrate.

7. The apparatus of claim 1, wherein:
an end of the first resistor of the first series connected RL circuit is connected to the first output node of the logic element; and
an end of the second resistor of the second series connected RL circuit is connected to the second output node of the logic element.

8. The apparatus of claim 1, wherein:
the first frequency is the second frequency.

9. An apparatus, comprising:
a first circuitry, implemented using current-controlled complementary metal-oxide semiconductor (C³MOS) logic with inductive broadbanding, wherein logic levels are signaled by current steering in one of two or more branches in response to differential input signals that correspond to a first signal, and wherein first and second series connected RL circuits respectively couple first and second output nodes of a first logic element to a power supply node, that is operable to:
receive a first signal;
process the first signal thereby generating a first plurality of signals such that each signal of the first plurality of signals has a first frequency; and
output the first plurality of signals; and
a second circuitry, implemented using C³MOS logic, wherein logic levels are signaled by current steering in one of two or more branches in response to differential input signals that correspond to at least one signal of the first plurality of signals, and wherein third and fourth series connected RL circuits respectively couple third and fourth output nodes of a second logic element to the power supply node, that is operable to:
- receive the first plurality of signals;
- process the first plurality of signals thereby generating a second signal such that the second signal has a second frequency; and
- output the second signal.

10. The apparatus of claim 9, wherein:
the second circuitry it is operable to process the first plurality of signals thereby generating a second plurality of signals such that each signal of the second plurality of signals has the second frequency; and
the second signal is one signal within the second plurality of signals.

11. The apparatus of claim 9, wherein:
the first signal has a third frequency;
the third frequency is less than the first frequency; and
the third frequency is less than the second frequency.

12. The apparatus of claim 9, wherein:
the first signal is a serialized signal; and
the first signal is deserialized to generate the first plurality of signals that is a deserialized version of the first signal.

13. The apparatus of claim 9, further comprising:
first and second capacitive loads respectively coupled to the first and second output nodes of the first logic element.

14. The apparatus of claim 9, further comprising:
first and second capacitive loads respectively coupled to the first and second output nodes of the second logic element.

15. The apparatus of claim 9, wherein:
each RL circuit of the first and second series connected RL circuits includes a resistor and an inductor connected in series; and
the inductor of each RL circuit of the first and second series connected RL circuits is a spiral inductor coupled to the silicon substrate.

16. The apparatus of claim 9, wherein:
an end of the first resistor of the first series connected RL circuit is connected to a first output node of the first logic element; and
an end of the second resistor of the second series connected RL circuit is connected to a second output node of the first logic element.

17. The apparatus of claim 9, wherein:
the first frequency is the second frequency.

18. An apparatus, comprising:
a circuitry, implemented using current-controlled complementary metal-oxide semiconductor ($C^3MOS$) logic with inductive broadbanding, that is operable to:
receive a first plurality of signals such that each signal of the first plurality of signals has a first frequency;
process the first plurality of signals thereby generating a serialized signal there from such that the serialized signal has a second frequency, wherein the serializer includes:
- a first differential transistor that includes a first gate, a first source, and a first drain;
- a second differential transistor that includes a second gate, a second source, and a second drain;
- a current source that is coupled to both the first source and the second source;
- a first series connected RL circuit that communicatively couples between the first drain and a logic high level;
- a second series connected RL circuit that communicatively couples between the second drain and the logic high level;
- a first capacitive load coupled to the first drain; and
- a second capacitive load coupled to the second drain; and wherein:
the first gate and the second gate are differential inputs of the serializer that receive at least one signal of the first plurality of signals; and
the first drain and the second drain are differential outputs that output at least a portion of the serialized signal.

19. The apparatus of claim 18, wherein:
the current source is implemented using a metal-oxide semiconductor field-effect transistor (MOSFET) having a third drain, a third gate, and a third source;
the third drain couples to the first source; and
the third drain couples to the second source.

20. The apparatus of claim 18, further comprising:
at least one additional circuitry, implemented using current-controlled complementary metal-oxide semiconductor ($C^3MOS$) logic, that is operable to:
receive a second plurality of signals such that each signal of the second plurality of signals has a third frequency; and
process the second plurality of signals thereby generating the first plurality of signals that us received by the circuitry, implemented using $C^3MOS$ logic with inductive broadbanding.

* * * * *